(12) United States Patent
Shank

(10) Patent No.: US 9,840,185 B2
(45) Date of Patent: *Dec. 12, 2017

(54) VEHICLE ACCESSORY CONTROL ARRANGEMENT

(71) Applicant: UUSI, LLC, Reed City, MI (US)

(72) Inventor: David W. Shank, Hersey, MI (US)

(73) Assignee: UUSI, LLC, Reed City, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/362,703

(22) Filed: Nov. 28, 2016

(65) Prior Publication Data

US 2017/0072835 A1 Mar. 16, 2017

Related U.S. Application Data

(63) Continuation-in-part of application No. 14/168,036, filed on Jan. 30, 2014, now Pat. No. 9,538,589.

(Continued)

(51) Int. Cl.
*H01R 12/62* (2011.01)
*H05K 1/02* (2006.01)
(Continued)

(52) U.S. Cl.
CPC ........... *B60Q 1/0088* (2013.01); *H01R 12/62* (2013.01); *H05B 33/0803* (2013.01); *H05B 33/086* (2013.01); *H05B 33/0845* (2013.01); *H05B 37/0227* (2013.01); *H05K 1/02* (2013.01); *H05K 1/14* (2013.01); *H05K 1/142* (2013.01); *H05K 1/117* (2013.01); *H05K 1/16* (2013.01);
(Continued)

(58) Field of Classification Search
CPC .... H05B 33/0803; H05B 33/086; H05K 1/02; H05K 1/142; H05K 1/117; H05K 1/16; H05K 2201/09027; H05K 2201/09045; H05K 2201/09081; H05K 2201/09154; H05K 2201/09163; H05K 2201/097; H05K 2201/09709; H05K 2201/0979; H05K 2201/0999; H05K 2201/10053
USPC ...................................... 315/76–84
See application file for complete search history.

(56) References Cited

U.S. PATENT DOCUMENTS 5,557,506 A     9/1996   Wood et al.
5,801,340 A *   9/1998   Peter ................. G01S 13/04
                                          178/20.04

(Continued)

*Primary Examiner* — Brandon S Cole
(74) *Attorney, Agent, or Firm* — Howard & Howard Attorneys PLLC

(57) ABSTRACT

An illustrative inventory of vehicle accessory control components includes a plurality of first circuit boards and a plurality of second circuit boards. The first circuit boards each have a substrate with a plurality of circuit elements supported on the substrate. The first circuit board substrates have an overall perimeter shape including an outer edge profile and a plurality of first deviations from the outer edge profile. The second circuit boards each have a substrate with a plurality of circuit elements supported on them. The second circuit board substrates have the overall perimeter shape including the same outer edge profile as the first circuit board substrates. The second circuit board substrates include a plurality of second deviations from the outer edge profile. At least one portion of the second deviations is different than the first deviations of the first circuit boards.

20 Claims, 7 Drawing Sheets

Related U.S. Application Data

(60) Provisional application No. 61/859,837, filed on Jul. 30, 2013.

(51) Int. Cl.
*H05K 1/16* (2006.01)
*B60Q 1/00* (2006.01)
*H05K 1/14* (2006.01)
*H05B 37/02* (2006.01)
*H05B 33/08* (2006.01)
*H05K 1/11* (2006.01)

(52) U.S. Cl.
CPC ... *H05K 2201/04* (2013.01); *H05K 2201/097* (2013.01); *H05K 2201/09027* (2013.01); *H05K 2201/09045* (2013.01); *H05K 2201/0979* (2013.01); *H05K 2201/09081* (2013.01); *H05K 2201/0999* (2013.01); *H05K 2201/09154* (2013.01); *H05K 2201/09163* (2013.01); *H05K 2201/09709* (2013.01); *H05K 2201/10053* (2013.01); *H05K 2201/10151* (2013.01); *H05K 2201/10356* (2013.01)

(56) References Cited

U.S. PATENT DOCUMENTS

| | | | |
|---|---|---|---|
| 6,047,470 A | 4/2000 | Drussel et al. | |
| 8,626,384 B2 | 1/2014 | Newman et al. | |
| 8,842,441 B2 * | 9/2014 | Bai | H01R 12/737 |
| | | | 361/728 |
| 9,046,967 B2 | 6/2015 | Newman et al. | |
| 9,051,769 B2 | 6/2015 | Washeleski et al. | |
| 9,136,624 B1 * | 9/2015 | Reynov | H01R 23/722 |
| 9,532,471 B2 * | 12/2016 | Wang | H05K 7/1445 |
| 2002/0009926 A1 | 1/2002 | Mickievicz et al. | |
| 2005/0048838 A1 | 3/2005 | Korsunsky et al. | |
| 2007/0184676 A1 * | 8/2007 | Minich | H01R 12/714 |
| | | | 439/65 |
| 2007/0258266 A1 | 11/2007 | Baek et al. | |
| 2008/0048567 A1 | 2/2008 | Steele et al. | |
| 2009/0009092 A1 | 1/2009 | Routledge | |
| 2013/0308280 A1 | 11/2013 | Huang et al. | |

\* cited by examiner

VEHICLE ACCESSORY CONTROL ARRANGEMENT

CROSS REFERENCE TO RELATED APPLICATIONS

This application is a continuation-in-part of U.S. patent application Ser. No. 14/168,036, filed Jan. 30, 2014, which claims priority to U.S. Provisional Patent Application No. 61/859,837, filed on Jul. 30, 2013, the disclosures of which are hereby incorporated in their entireties.

BACKGROUND

Modern vehicles may have a control interface for allowing an individual to control a variety of vehicle accessories. Typical control interfaces include multiple inputs, such as switches, and may include a display for displaying information regarding an accessory. For example, a center stack console situated between the driver and front passenger seats may be configured to allow the driver and front passenger to access and control a variety of vehicle accessories, such as audio, navigation and temperature control. Some control interfaces include surfaces divided into areas with different areas being associated with different accessories. Each area may include mechanical switches, such as push buttons, rockers, slide switches, or rotary switches, which an individual uses to control a desired accessory or its function.

One challenge presented to vehicle manufacturers is how to accommodate the increasing number of controls required for the increasing number of accessories that are becoming available for vehicles. Additionally, the switches are associated with circuit elements on a printed circuit board that supports the electrical switch connections and appropriate circuitry to convey signals to a controller based upon switch operation. In some situations, there may be more than fifty individual connections associated with a vehicle accessory control assembly. As the number of vehicle accessories and their features increases, it becomes increasingly challenging to realize a control interface that is arranged in a manner that is comprehensive and intuitive to the operator. The control interface has to be accessible and convenient to operate to avoid distracting an individual from the task of driving the vehicle, for example. Additionally, it is necessary to have a visually appealing control interface to satisfy consumers.

Not only is the outward appearance of the control interface potentially complex and challenging, but the circuitry used for realizing the desired control also is becoming increasingly complex.

SUMMARY

An illustrative inventory of vehicle accessory control components includes a plurality of first circuit boards and a plurality of second circuit boards. The first circuit boards each have a substrate with a plurality of circuit elements supported on the substrate. The first circuit board substrates have an overall perimeter shape including an outer edge profile and a plurality of first deviations from the outer edge profile. The second circuit boards each have a substrate with a plurality of circuit elements supported on them. The second circuit board substrates have an overall perimeter shape including the same outer edge profile as the first circuit board substrates. The second circuit board substrates include a plurality of second deviations from the outer edge profile. At least one portion of the second deviations is different than the first deviations of the first circuit boards.

The difference between the deviations of the first circuit board substrates and the second circuit board substrates facilitates dedicating the first circuit boards to one vehicle arrangement while dedicating the second circuit boards to a different vehicle arrangement. Having the same overall perimeter shape and outer edge profile for the first circuit boards and the second circuit boards facilitates having a generally consistent design and layout of the circuit elements supported on the substrates, which enhances manufacturing and design economies and allows for an arrangement that accommodates the complexities of a vehicle accessory control interface for a variety of vehicles.

Various features and advantages of disclosed example embodiments will become apparent from the following detailed description. The drawings that accompany the detailed description can be briefly described as follows.

DETAILED DESCRIPTION

Technology improvements and consumer desire for more sophisticated vehicles have prompted vehicle manufacturers to attempt to provide feature rich accessories and to expand their list of vehicle options. Increasing the number of vehicle accessories and options places a heavier burden on vehicle accessory control interfaces, such as by requiring expanding size and complexity of accessory input controls. Successfully managing vehicle accessory control interface design requires careful consideration into how to best accomplish the design to promote maximum flexibility of the interface for use among a variety of vehicle platforms and with a variety of options.

An inventory of vehicle accessory control components designed according to an embodiment of this invention includes a strategic arrangement of components on a printed circuit board that allows for implementation flexibility while maintaining common aspects among various configurations to control cost. A densely packed circuitry arrangement is supported on printed circuit boards having an overall perimeter shape that is selected to be useful for a variety of vehicles and a variety of accessory control interface configurations. Deviations from the common overall perimeter shape allow for identifying and controlling which of the circuitry boards within an inventory is intended to be included with which of the vehicles or vehicle accessory control interfaces.

Figure 1:
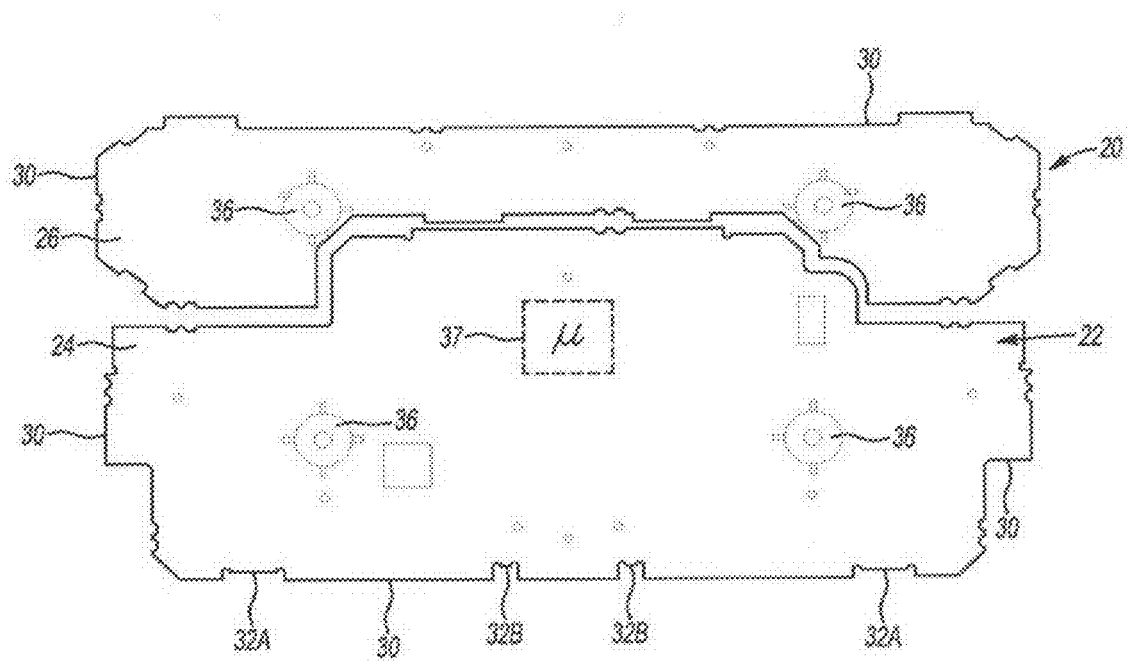
FIG. 1 schematically shows selected features of an example circuit board configuration designed according to an embodiment of this invention.

FIG. 1 schematically shows selected features of an example vehicle accessory control component 20. A printed circuit board substrate 22 includes a first board portion 24 and a second board portion 26. The two board portions 24 and 26 are selectively moveable relative to each other to situate them in a variety of different positions relative to each other. Using two board portions 24 and 26 instead of a single board portion allows for more flexibility in the vehicle accessory control interface design because different orientations and placement of the board portions relative to each other allows for the same basic circuit board layout to be readily situated in a variety of vehicles and to accommodate a variety of control interface configurations.

The substrate 22 has an overall perimeter shape 30 that establishes an outer edge profile of the circuit board substrate 22. The example of FIG. 1 includes a plurality of deviations 32 from the outer edge profile 30. In this example, some of the deviations 32A comprise recesses and protrusions as can be appreciated from the drawing. Other deviations 32B comprise recesses and protrusions, however, they are of a different size and shape compared to those of the deviations 32A.

FIG. 1 shows some example deviation configurations. Other deviations may comprise at least one of recesses, notches, radii, chamfers, tabs, or protrusions. Additionally, the number of deviations or the placement of the deviations may vary.

Figure 2:
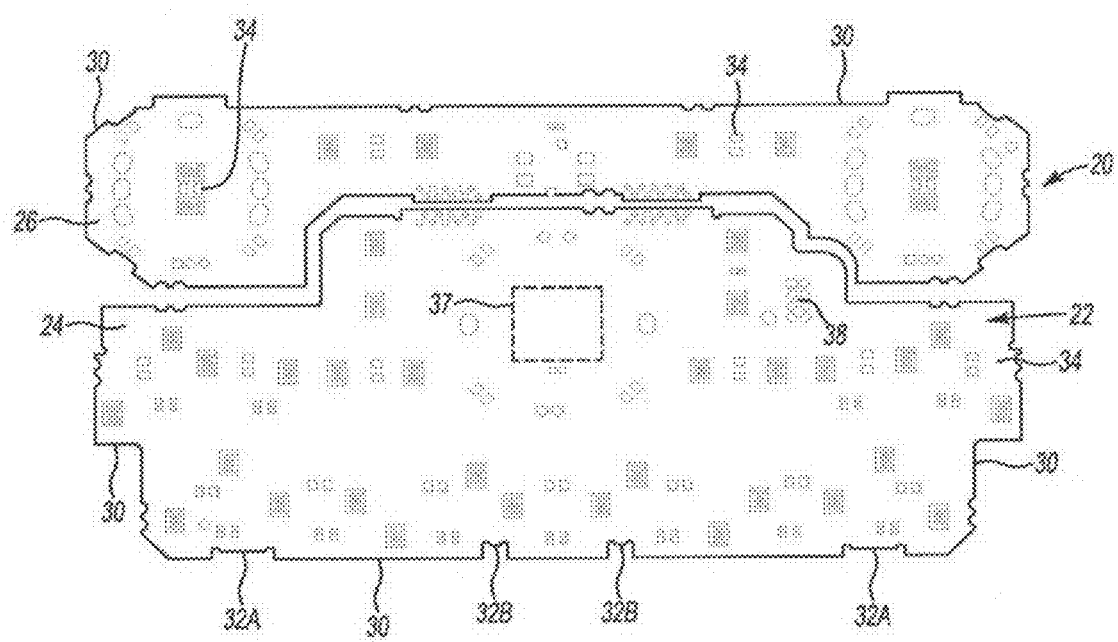
FIG. 2 schematically illustrates additional features of the example circuit board from FIG. 1.

As shown in FIG. 2, the circuit board substrate 22 supports a plurality of electronic components 34. The placement of the components is intended to accommodate a variety of accessory control interface configurations. One feature of the arrangement of the electronic components 34 is that they are situated to minimize the length of circuit traces on the substrate 22 for interconnecting the components 34 and a controller 37. The central location of the controller 37 minimizes the length of communication or power traces along the substrate 22. Example embodiments include arrangements of the electronic components 34 to allow for enhanced placement and styling of input controls on the portion of the accessory control interface that is visible to an individual. Additionally, the electronic components 34 are situated on the substrate 22 to maximize the ability for the component arrangement to be used across different vehicle platforms and with various options.

As shown in FIG. 1, a plurality of mounting features 36 are included on the substrate 22. In some examples, the mounting features 36 comprise holes through the substrate where a fastener, such as a screw, may be received to secure the circuit board substrate 22 in a desired position. There are no electrical components included on the substrate in the location of the mounting features 36. The substrate 22 is at least partially physically supported by the mounting features 36 in some examples.

Figure 3:
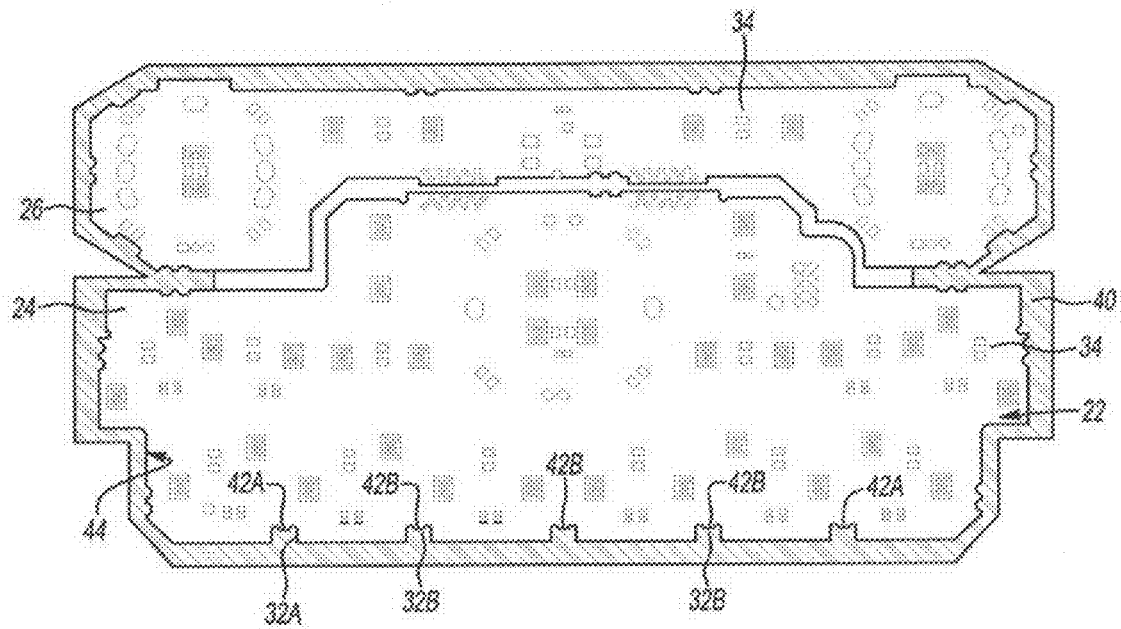
FIG. 3 schematically illustrates an example circuit board having one example overall perimeter shape situated within a housing having a corresponding configuration.

One aspect of the disclosed embodiments is that an inventory of circuit boards may be maintained for a variety of vehicles or different options among versions of a vehicle. FIG. 3 shows one substrate configuration that includes a plurality of deviations 32A and 32B that differs from those shown in the example of FIGS. 1 and 2. The arrangement shown in FIG. 4 corresponds to a substrate configuration as shown in FIGS. 1 and 2. Comparing FIGS. 3 and 4 reveals how different arrangements of deviations 32A and 32B facilitates ensuring that two different printed circuit boards having the same overall perimeter shape may be situated in an appropriate vehicle by configuring a housing to only receive a circuit board substrate 22 having an outer edge profile and deviations that correspond to the housing configuration.

In the example of FIG. 3, a housing 40 includes a plurality of control features 42A that are situated to correspond to the deviations 32A (e.g., the mounting features have the same shape, size and position as the deviations) on the substrate perimeter. Additional locating features 42B are situated (e.g., have a selected shape, size and position) to correspond to the deviations 32B. An inside perimeter 44 of the housing 40 corresponds to the outer edge profile 30 of the overall perimeter shape of the substrate 22.

Figure 4:
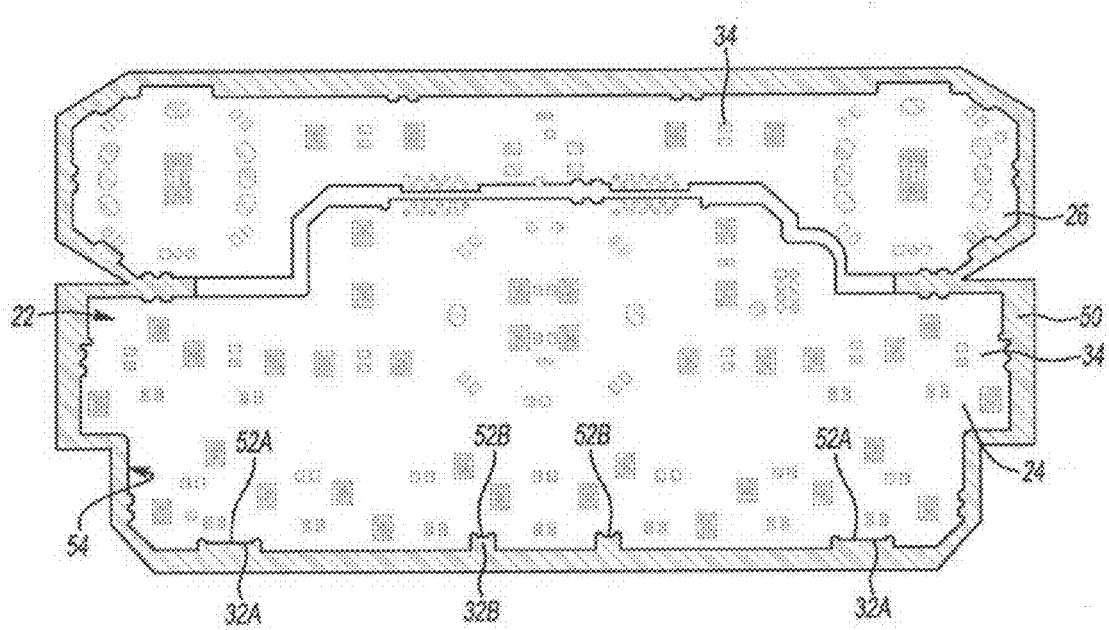
FIG. 4 schematically illustrates another circuit board embodiment having an overall perimeter shape that differs from the example of FIG. 3 with a correspondingly shaped housing.

FIG. 4 shows another housing configuration 50 including control features 52A and 52B that correspond in size, shape and position to deviations 32A and 32B, respectively, on the substrate 22 of this example. The inner perimeter 54 of the housing 50 corresponds to the outer edge profile 30 (of FIGS. 1 and 2) of the overall perimeter shape of the substrate 22.

As can be appreciated by comparing FIGS. 3 and 4, the substrate of FIG. 3 will not fit in the housing 50 of FIG. 4 and the substrate of FIG. 4 will not fit in the housing 40 of FIG. 3. By selecting the deviations 32A and 32B and having corresponding control features 42A, 42B or 52A, 52B on the housing controls where a particular substrate may be located. By controlling the inventory of housings and assigning appropriate housings to particular vehicles, only appropriate circuit boards from the inventory will be able to be situated in a vehicle where desired. The deviations on the substrates and the control features on the housings allow for having a significant amount of uniformity among a variety of circuit boards while, at the same time, maintaining reliable control over the placement of different circuit board configurations for different vehicles or different control interface configurations.

Comparing the embodiments of FIGS. 3 and 4, the arrangement of the electronic components 34 on the respective substrates is the same for a majority of the electronic components 34. Only the portion shown along the bottom (according to the drawings) of the substrate varies between the embodiments of FIGS. 3 and 4. In particular, different switch contact arrangements are included in the two different embodiments. Having a majority of the electronic components situated the same on the two circuit board configurations provides economies in manufacturing and inventory maintenance. The commonality between the two circuit board configurations allows for confidence in testing because there are no significant differences in the component placement or trace routing that may cause a non-conformance, such as in standard automotive EMC testing. Another feature of having such commonality among the different embodiments is that the processing of the circuit boards in handling equipment, component placement equipment and programs can be common among the various circuit board configurations. This introduces some of the economic advantages during the manufacturing and testing stages.

Figure 5:
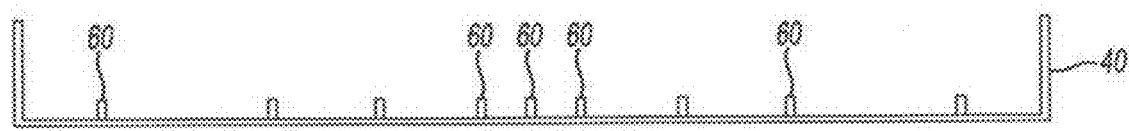
FIG. 5 schematically illustrates selected features of an example housing embodiment.

FIG. 5 illustrates additional features of an example housing 40. Support members 60 are provided within the housing 40 that are received against one side of the substrate 22 when the substrate 22 is received within the housing 40. The support features 60 are strategically placed in this example to maintain a uniform stiffness or feel across the entire surface of the substrate 22 during user interaction with the control interface. For example, when an individual presses a button to activate a switch supported on the substrate 22, the individual user feels the same response regardless of whether that switch is located near the perimeter of the substrate 22 or near a central portion of the substrate 22. The support features 60, such as posts, provide support beneath the substrate 22 to avoid different amounts of flexing across the surface of the substrate 22 depending on where a switch may be located, for example. The example support features 60 comprise posts that may have a round, square or hexagonal shape. The support features 60 in some embodiments comprise ribs or walls instead of individual posts.

Figure 6:
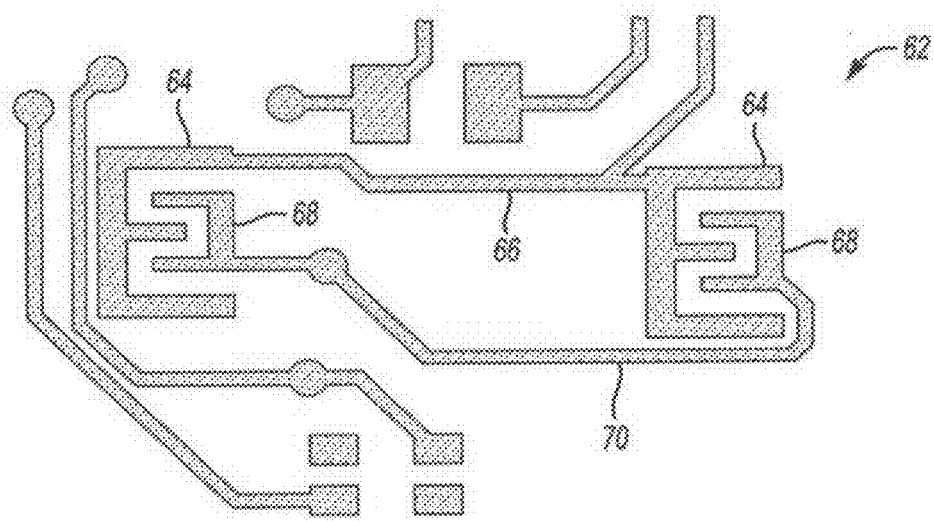
FIG. 6 schematically illustrates a switch contact configuration useful in an example embodiment.
Figure 7:
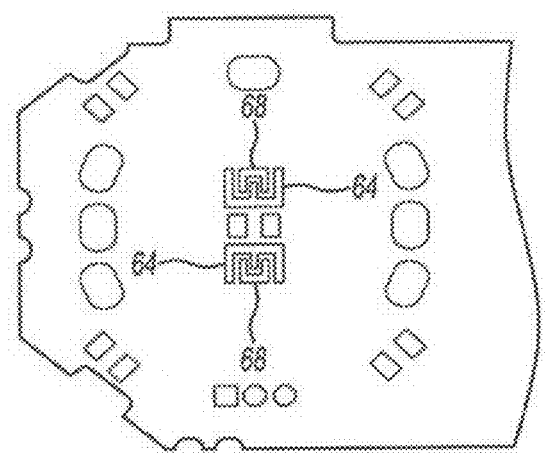
FIG. 7 schematically illustrates the switch contact configuration shown in FIG. 6 from another perspective.

FIGS. 6 and 7 show a feature of some example electronic components that may be supported on the substrate 22. This example shows a switch arrangement 62 that includes redundant sets of contacts. Two of the contacts 64 are generally E-shaped and are interconnected by a conductive member 66. Two other contacts 68 are generally C-shaped and interconnected by a conductive member 70. When an individual activates a corresponding switch, both sets of contacts 64 and 68 are situated to be closed so that an appropriate electrical signal is provided to the controller 37, for example. Having two sets of contacts connected in parallel provides redundancy so that if either of the sets of contacts were to wear out, the switch would remain functional, which reduces repair cost and inconvenience to the user.

In one example embodiment, the E-shaped contacts 64 and the C-shaped contacts 68 are formed on the substrate 22 out of copper. A carbon ink coating is provided over the copper-based connectors. When an individual activates the switch, a conductive member on the switch contacts the carbon ink coating over the contacts 64 and 68 to make the appropriate electrical connection to communicate an appropriate signal indicating the user's manipulation of the switch. Another example includes a gold, silver, nickel or other plating or coating in place of the carbon ink coating. Each of the coatings provides a durable and robust switching contact that is suitable for use in an automotive vehicle environment.

Figure 12:
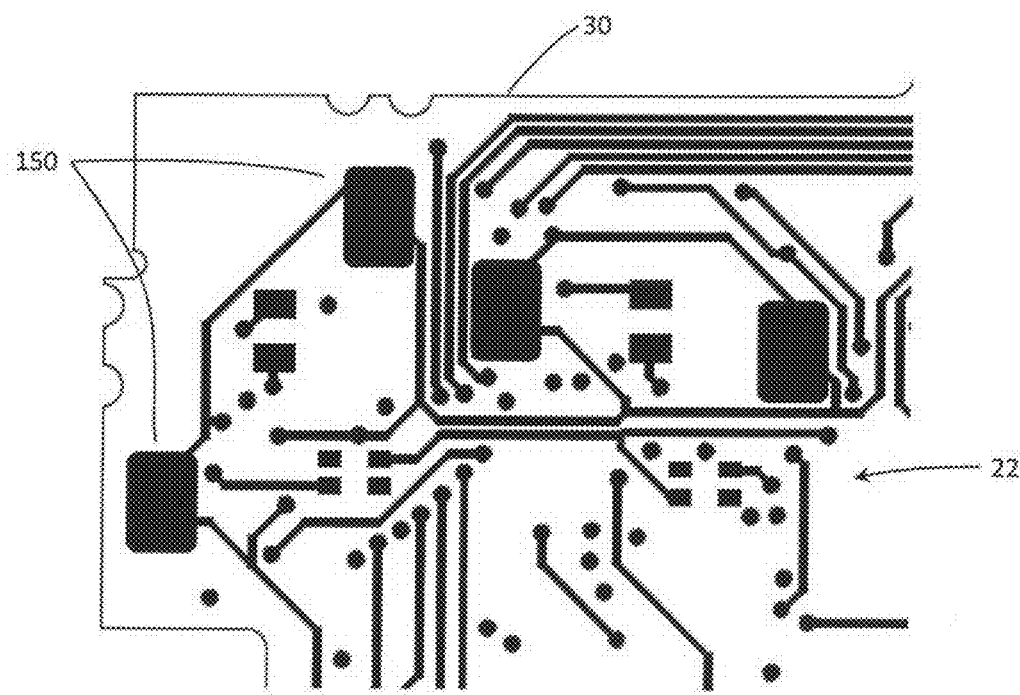
FIG. 12 schematically illustrates another embodiment, according to the present invention, of the example circuit board from FIG. 1.

In another embodiment illustrated in FIG. 12, the E and C-shaped contacts 64 and 66 can be replaced with a single pad area 150 made of a circuit board conductor, typically copper, on the substrate 22 in each of the required switch locations. The pad area switch locations could then be used as a capacitive sensor touch input. The area switch locations that form capacitive sensor touch pads will yield an indication that an operator is touching the surface associated with a touch pad when properly sensed. A sensing technology used could be that which is disclosed in U.S. Pat. Nos. 8,626,384, 9,046,967, and 9,051,769, the entire disclosures of which are hereby expressly incorporated by reference.

Figure 13:
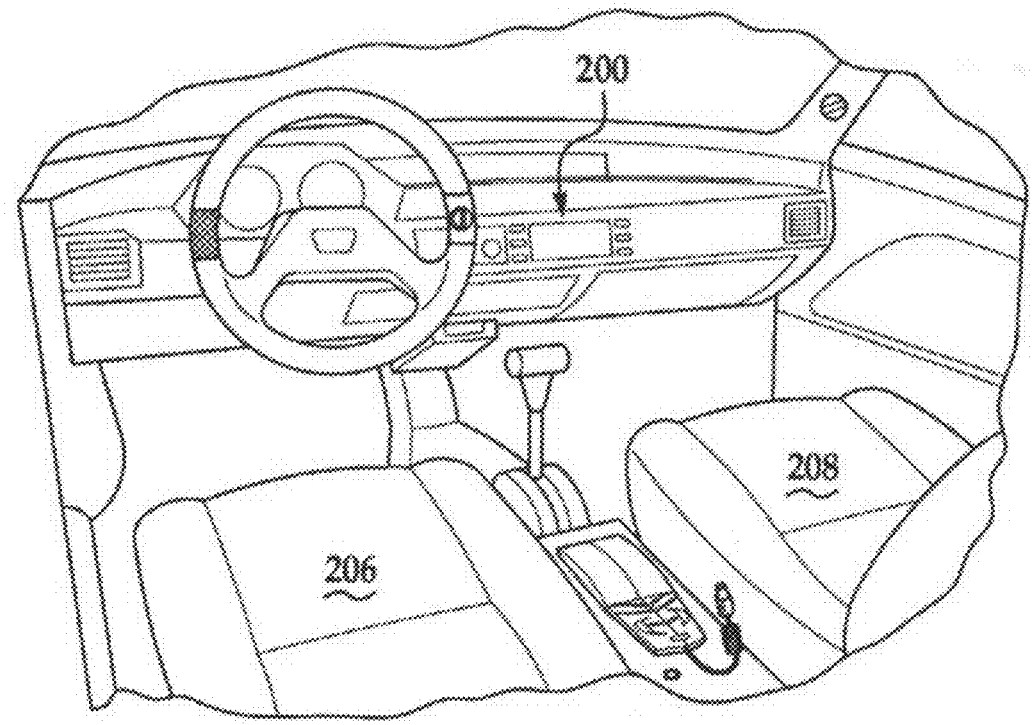
FIG. 13 schematically illustrates an interface, according to the present invention, located in a vehicle.

In yet another embodiment, a plurality of representative occupant status parameters or indicators may include at least one of where an occupant is seated, whether a seatbelt is latched, a stored preference selector, etc. The representative occupant status parameters are derived. As illustrated in FIG. 13, the occupant status parameters include at least one of an occupant position detection and/or an occupant presence detection using a conductor disposed within a vehicle seat 206 and 208 with an electrical signal applied to the conductor to act as a carrier or signature signal that is conducted through the occupant body and detected by the signal present at capacitive sensor touch pads located on substrate 22 that is located behind user interface 200 during occupant manipulation, such as a finger in proximity to or surface contact with, the interface 200 to determine which occupant is manipulating the user interface 200. The user interface 200 may control accessibility to various functions and/or may customize the user interface display and controls based on which occupant is manipulating the user interface 200. For example GPS location entry may be disabled for the occupant in a driver vehicle seat 206, but allowed for the occupant of a passenger vehicle seat 208 of a vehicle. In addition, various other vehicle and/or ambient status information may be used to determine the user interface configuration, display features, and/or available functions, for example.

Figure 8:
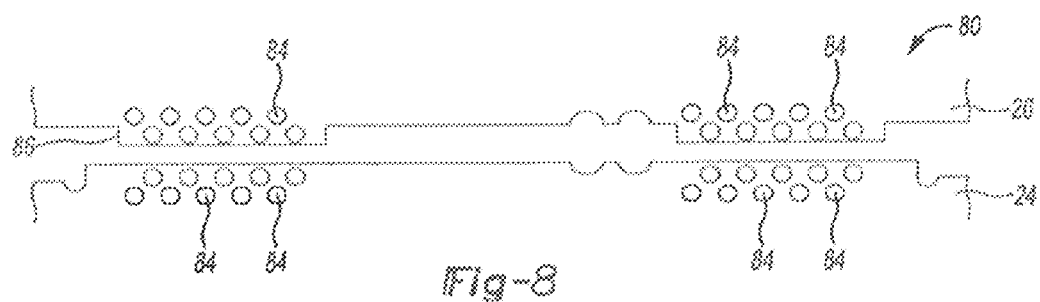
FIG. 8 schematically illustrates an example connection feature between circuit board substrate portions in an example embodiment.
Figure 9:
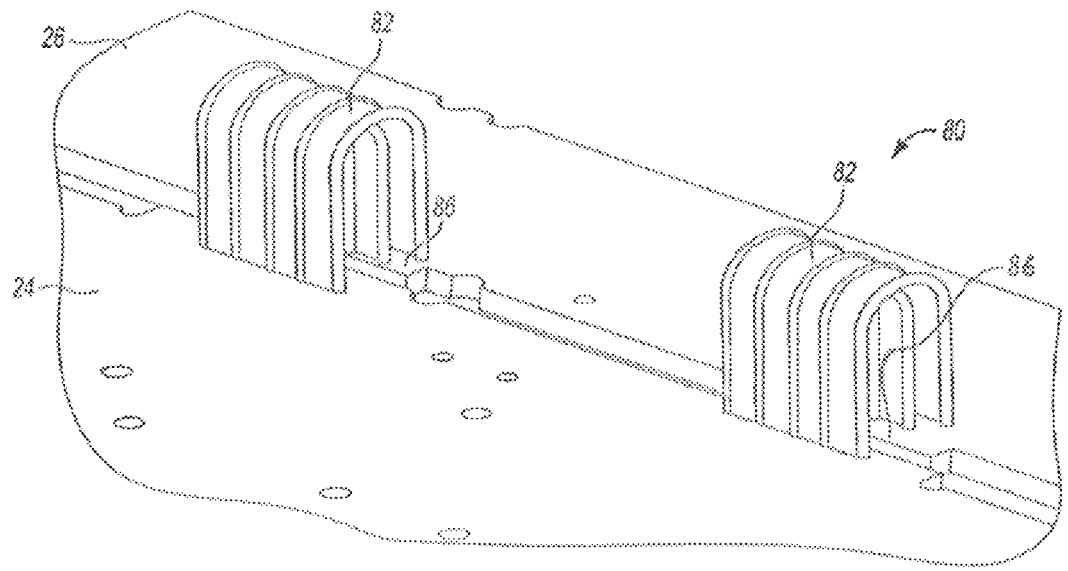
FIG. 9 schematically illustrates an embodiment of connectors between circuit board substrate portions.

As shown in FIGS. 8 and 9, the example embodiments include a connector arrangement 80 for connecting the substrate board portions or for establishing electrical connections among electronic components on the different board portions. This example includes ribbon cable connectors 82 having ends soldered at 84 to secure the ribbon cable connectors 82 to the board portions 24 and 26, respectively. Flexible ribbon cable connectors allow for manipulating the board portions 24 and 26 into a variety of positions relative to each other. The flexible ribbon cables also provide a reliable, electrically conductive connection between the board portions. Another feature of using flexible ribbon cable connectors 82 is that they require relatively little amount of space on the substrate, which allows for the densely packed arrangement of electronic components on the substrate. The illustrated example includes protrusions or tabs 86 on the board portions and the connection locations 84 are on the protrusions 86.

The positions of the electrical connections at 84 are staggered in this example to reduce a possibility of pin-to-pin short-circuiting that otherwise is more likely to occur during the soldering process.

One of the electronic components shown in FIG. 2 is a connector 38. The placement of the connector 38 is situated to maintain a clear communications path with limited transitions from one board layer to another. This type of arrangement is particularly useful with a CAN or other bus configuration where there are differential lines that must maintain equal impedances along a circuit trace path. The example placement of the connector 38 provides a short, clean path to the power supply (not illustrated) on the circuit board. Minimizing the length of the trace to the power supply provides a more efficient arrangement. Additionally, longer traces tend to increase electromagnetic emissions and render the overall circuitry more susceptible to electromagnetic noise, such as that which occurs with bulk current injection. Minimizing EMI emissions in vehicle electronics is important and the illustrated example addresses that concern.

Similarly, the position of the controller 37 achieves the EMC and other test requirements for vehicle applications. In a high density circuit such as that shown in the illustrated example, there is very limited component location freedom and an inventory designed according to an embodiment of this invention includes such uniformity in the position of a majority of the circuit components to avoid the difficulties of having to determine locations for all of the necessary components while still meeting all functional, test and manufacturing requirements.

Figure 10:
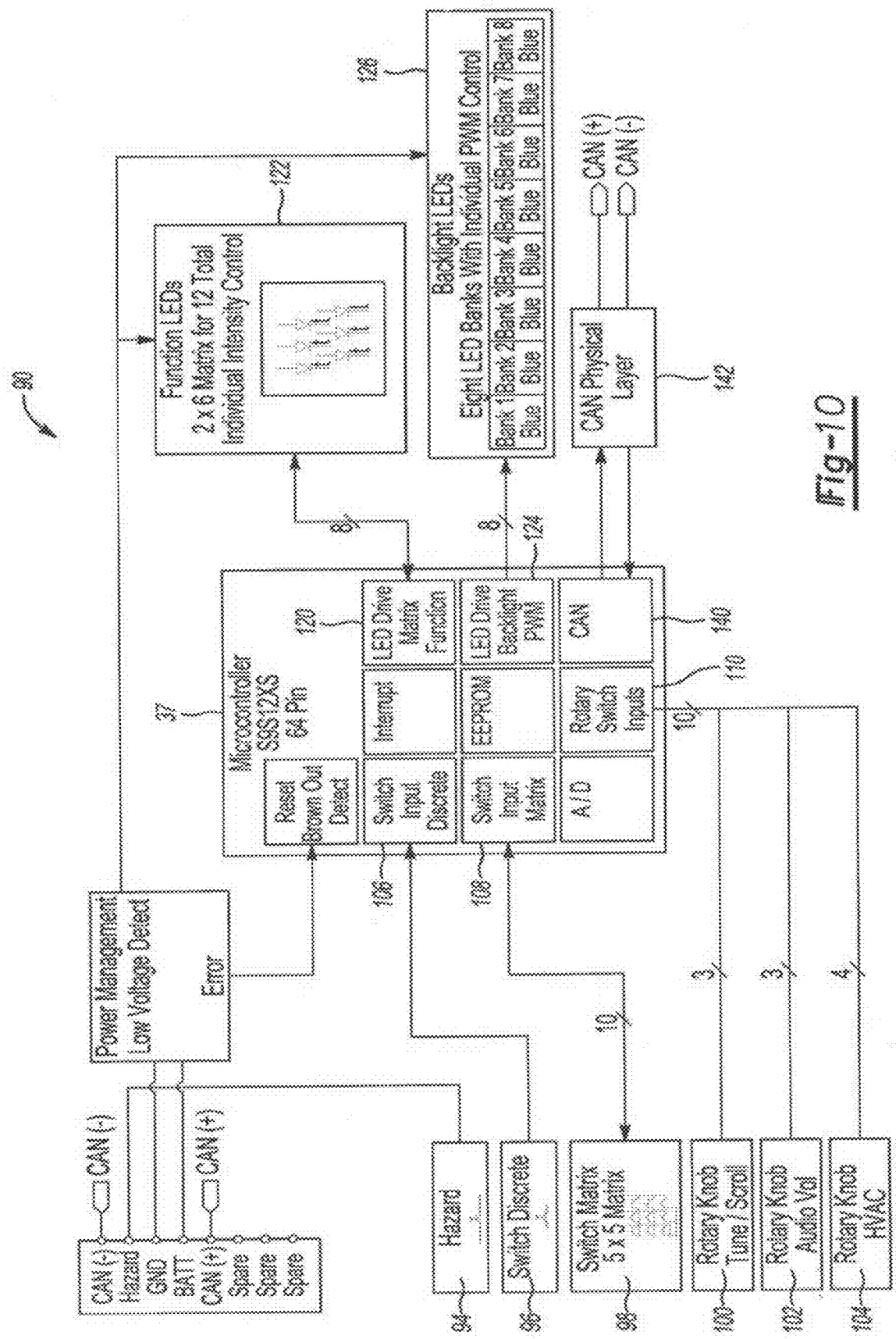
FIG. 10 schematically illustrates a control arrangement designed according to an embodiment of the invention.

FIG. 10 schematically illustrates selected portions of an example vehicle accessory control interface 90. A microcontroller 37 has various capabilities that allow for controlling various functions of a variety of vehicle accessories. The illustrated example includes a plurality of input devices such as discrete switches 94 and 96, a switch matrix 98, and rotary knob switches 100, 102 and 104. The microcontroller 37 includes a discrete switch input module 106 for interpreting input information based upon user activation of the switches 94 and 96, respectively. The microcontroller 37 includes a switch input matrix module 108 that is configured for interpreting inputs from the switch matrix 98. In one example, the switch matrix 98 includes five columns and five rows of drive and sense connections such that up to 25 switches may be scanned and interpreted by the switch matrix module 108 of the microcontroller 37. Other examples include different matrix configurations (e.g., different numbers of rows and columns of drive and sense connections).

A rotary switch input module 110 of the microcontroller 37 is configured to interpret inputs from the rotor knob switches 100, 102 or 104.

Another feature of the microcontroller 37 is that it includes a driver matrix 120 for controlling a display output such as a matrix of LEDs 122. The LEDs 122 may be used to indicate the status of various functions and options in an automotive environment, such as rear defrost, park assist, and traction control. Individual display indicators in this arrangement may be individually controlled to a particular, desired intensity.

The example of FIG. 10 includes a LED backlight drive control module 124 and a plurality of banks 126 of LEDs with each bank being capable of being driven independently. In one example embodiment, LEDs are grouped into eight banks based on their color and their location on the vehicle accessory control interface. Illuminated halos around different control knobs, for example, may be banked together since they all have similar light path structures and the same illumination color. A larger knob halo may have a separate bank of LEDs if necessary. Another example arrangement of the LEDs is that all red LEDs, such as would be used for a hazard switch and a temperature increase switch, may be banked together.

Figure 11:
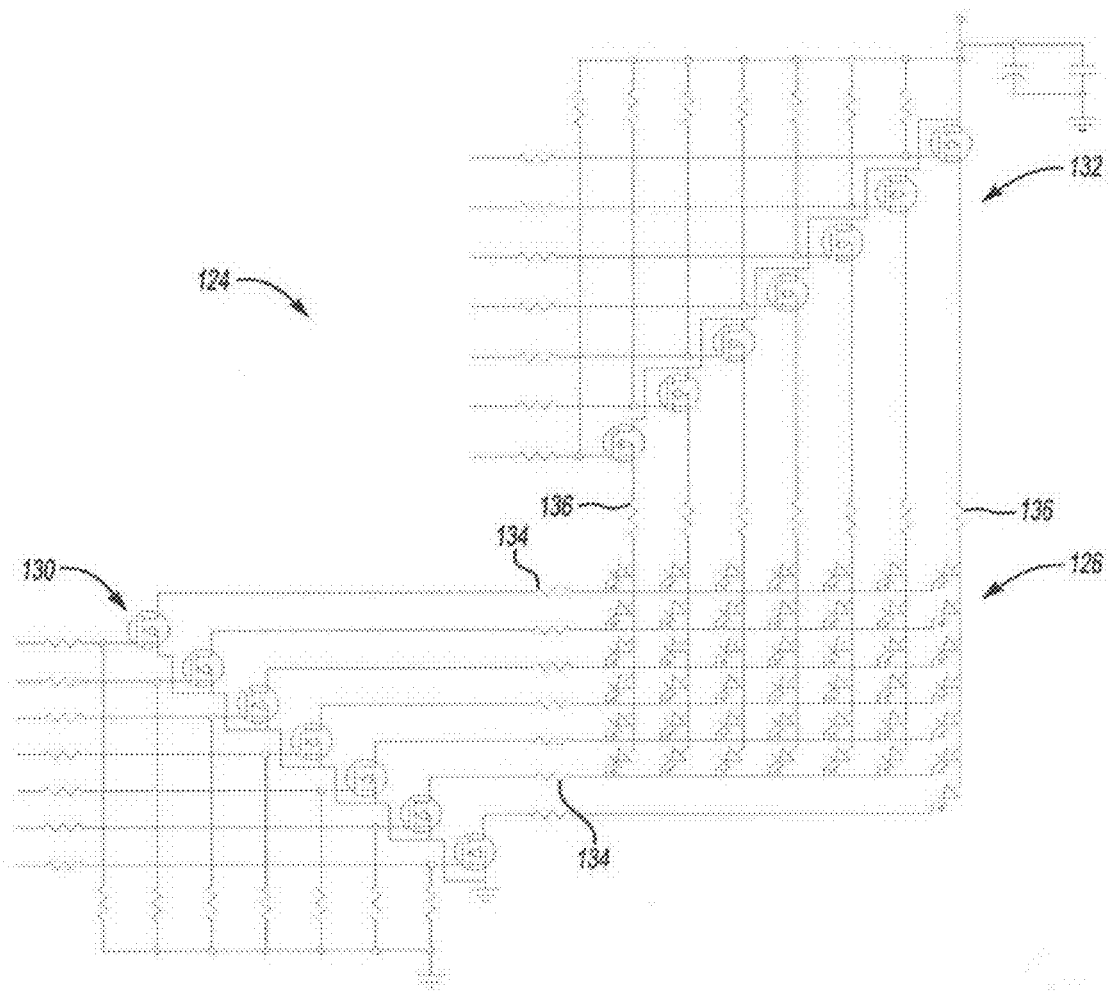
FIG. 11 schematically illustrates a driver and lighting elements for a lighting function of an example embodiment.

FIG. 11 schematically illustrates an example arrangement of the matrix drive module 124. This example includes seven rows 130 and seven columns at 132 for a total drive capability of 49 displays. Other embodiments include different numbers of columns or rows and different numbers of potential individually controllable displays.

The display elements at 126 may be incandescent lights, LCD, LEDs or other components. Each of the LEDs in this example is fully addressable. Each of the LED lights can have a different intensity by changing the on time of each LED by the microcontroller 37 controlling the switches in the rows 130 or the columns 132. For example, as the matrix is scanned, the drive signal presented to each LED is, in effect, a pulse width modulated signal. A pulse width modulated signal allows the software of the microcontroller 37 to control the intensity of each LED. In this example, at least one limiting resistor 134 is placed in series with each LED row instead of having a limiting resistor placed in series with each LED, individually. The illustrated example includes limiting resistors 136 in series with each LED column.

One feature of the arrangement shown in FIG. 11 is that the microcontroller 37 is programmed to control a power signal to a selected driver based at least in part on the value of the drive resistor 134 of the corresponding row (or resistor 136 of a corresponding column) in which the selected driver is situated. The microcontroller 37 provides a pulse width modulated power signal to the drivers, respectively, in this embodiment. A characteristic of the pulse width modulated power signal for one of the drivers is different than the characteristic of the power signal for another one of the drivers. In this manner, the lighting elements associated with one of the drivers emit light differently than those associated with the other driver because the characteristic of the pulse width modulated power signals are different.

An arrangement as shown in FIG. 11 allows for consistently achieving uniform light intensity across the various knobs or switches of the vehicle accessory control interface. The illustrated arrangement avoids drawbacks associated with previous configurations. Different buttons or switches on a control interface may have different legends or have different light piping characteristics. Two buttons having similar light piping and legend characteristics may have a similar current limiting resistor value to achieve consistent illumination. In many situations, a variety of resistor values typically are required. During development of a vehicle accessory control interface, extreme care and scrutiny is typically given to how the lighting appears across the face of the control so that the buttons or legends all appear with the desired brightness or illumination, which is typically uniform across the interface.

With previous arrangements, if a particular button or legend was too bright or too dim, a designer would have to remove the circuit board from the mounting hardware, remove a resistor associated with the affected lighting elements, desolder that resistor and replace it with another of a different value to hopefully achieve the desired light intensity in that location. Such trial and error approaches are avoidable using the arrangement of FIG. 11 because the microcontroller 37 may simply be reprogrammed to change the characteristic of the pulse width modulated power signal for any one of the drivers to alter the resulting intensity of any lighting elements controlled through that driver. Changing the pulse width modulation value, for example, for each row or column of lighting elements (e.g., LEDs) allows for varying the brightness or light intensity at any location across a vehicle accessory control interface without requiring the resistor replacement technique mentioned above.

Another feature of the arrangement in FIG. 10 is that the microcontroller 37 includes communication capability schematically represented at 140 and 142. This example allows for connecting the user interface to a vehicle communication bus such as a CAN bus. An example includes the capability of communicating using an I-bus operating at 125 KB/S. Providing bus communication capability allows for reducing the wire harness size between the vehicle components and the vehicle accessory interface. This introduces additional cost and space savings. Bus communication ability provides another feature in that it reduces the number of interconnections between different modules, which reduces the pin count on interface connectors. Having fewer connections allows for savings during manufacturing and reduces potential quality control issues (e.g., solder joints, terminal-to-terminal interfaces, crimp joints, and the like are susceptible to error or failure and reducing the number of them improves the reliability of the overall arrangement). Additionally, reducing connections and wire count contributes to reducing vehicle weight, which may be useful for enhancing fuel economy.

The example embodiments disclosed above demonstrate how an inventory of vehicle accessory control components designed according to an embodiment of this invention can satisfy differing needs for different vehicles and different configurations of control interfaces while maintaining consistency, reliability and cost control. Additionally, several features of the disclosed arrangement enhance the reliability and controllability of the interface.

The preceding description is illustrative rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. An inventory of vehicle accessory control components, comprising:
    a substrate having an overall perimeter shape including a first circuit board substrate and a second circuit board substrate;
    a plurality of first circuit boards that each have the first circuit board substrate with a plurality of circuit elements supported on the first circuitry board substrate, the first circuit board substrate including an outer edge profile and a plurality of first deviations from the outer edge profile;
    a plurality of second circuit boards that each have the second circuit board substrate with a plurality of circuit elements supported on the second circuit board substrate, the second circuit board substrate including the outer edge profile and a plurality of second deviations from the outer edge profile, at least one portion of the second deviations being different than the first deviations;
    wherein each first circuit board substrate and each second circuit board substrate are arranged in a plane and selectively movable relative to each other to form the overall perimeter shape of the substrate;
    wherein the outer edge profile is configured to facilitate one of the first and second circuit boards being received in a housing having a correspondingly shaped perimeter that generally conforms to the outer edge profile; the first deviations are configured to cooperate with first features on a housing to allow one of the first circuit boards to be received into a housing having the first features but not to be received into another housing that does not have the first features; and the second deviations are configured to cooperate with second features on a housing to allow one of the second circuit boards to be received into a housing having the second features but not to be received into another housing that does not have the second features;
    wherein the plurality of circuit elements of at least the plurality of first circuit boards comprise a plurality of switches; and
    a single pad area made of circuit board conductor on the first circuit board substrate in a location for each of the plurality of switches.

2. The inventory of claim 1, wherein the pad area is a capacitive sensor touch input.

3. The inventory of claim 1, including a plurality of representative occupant status parameters.

4. The inventory of claim 3, the representative occupant status parameters include at least one of where an occupant is seated, whether a seatbelt is latched, and stored preference selector.

5. The inventory of claim 3, includes at least one of the plurality of representative occupant status parameters includes at least one of an occupant position detection and an occupant presence detection including a conductor disposed within a vehicle seat with an electrical signal applied to the conductor to act as a carrier signal that is detected by a signal present at the pad area located on first circuit board substrate that is located behind a user interface during one of proximity to and surface contact with the user interface to determine which occupant is manipulating the user interface.

6. The inventory of claim 1, wherein first deviations comprise at least one of recesses, notches, radii, chamfers, tabs, or protrusions situated at least partially along the outer edge profile; and the second deviations comprise at least one of recesses, notches, radii, chamfers, tabs, or protrusions situated at least partially along the outer edge profile.

7. The inventory of claim 1, wherein at least the first circuit board substrates and the second circuit board substrates can be selectively moved into a plurality of positions relative to each other; a plurality of connectors respectively establish an electrical connection between the two first and second circuit board substrates or between circuit elements supported on the first and second circuit board substrates; and the connectors comprise ribbon cables.

8. The inventory of claim 7, wherein ends of the ribbon cables are secured to a corresponding one of the board portions by solder.

9. The inventory of claim 1, wherein at least the first circuit boards each comprise a microcontroller supported on the substrate in a central location relative to the perimeter.

10. The inventory of claim 1, wherein each of the switches has redundant switch contacts.

11. The inventory of claim 10, wherein the redundant switch contacts comprise at least one of carbon coating, gold coating, nickel coating, and silver coating.

12. The inventory of claim 1, wherein the circuit elements of at least the first circuit boards comprise: a plurality of lighting elements configured to provide light to a component situated in a vicinity of the circuit board; a plurality of drivers associated with the lighting elements for providing power to the lighting elements, respectively; and a controller that provides a power signal to each of the drivers, the controller being programmed to provide power to each driver to achieve a desired lighting characteristic of an associated one of the lighting elements.

13. The inventory of claim 12, wherein the plurality of drivers are arranged in a matrix comprising a plurality of rows; each row has at least one associated drive resistor electrically coupled with the row such that power supplied to the row flows through the drive resistor; and the controller is programmed to control a power signal to a selected driver based at least in part on a value of the drive resistor of the row in which the selected driver is situated.

14. The inventory of claim 13, wherein the controller provides a pulse width modulated power signal to the drivers, respectively; and a characteristic of the pulse width modulated power signal for one of the drivers is different than the characteristic of the pulse width modulated power signal for one other one of the drivers such that the lighting elements associated with the one of the drivers and the other one of the drivers emit light differently.

15. The inventory of claim 12, wherein the lighting elements comprise light emitting diodes.

16. A vehicle accessory control interface, comprising:
a circuit board substrate;
a plurality of electronic components supported on the substrate, the plurality of electronic components including:
a plurality of lighting elements configured to provide light to a component situated in a vicinity of the circuit board substrate;
a plurality of drivers associated with the lighting elements for providing power to the lighting elements, respectively;
a controller that provides a power signal to each of the drivers, the controller being programmed to provide power to each driver to achieve a desired lighting characteristic of an associated one of the lighting elements;
a plurality of switches located on the circuit board substrate;
a single pad area made of circuit board conductor on the circuit board substrate in a location for each of the switches; and
wherein the plurality of drivers are arranged in a matrix comprising a plurality of rows; each row has at least one associated drive resistor electrically coupled in series with the row such that power supplied to the row flows through the drive resistor; and the controller is programmed to control a power signal to a selected driver based at least in part on a value of the drive resistor of the row in which the selected driver is situated.

17. The device of claim 16, wherein the controller provides a pulse width modulated power signal to the drivers, respectively; and a characteristic of the pulse width modulated power signal for one of the drivers is different than the characteristic of the pulse width modulated power signal for one other one of the drivers such that the lighting elements associated with the one of the drivers and the other one of the drivers, respectively, emit light differently.

18. The device of claim 16, wherein at least one of the rows includes a plurality of the drivers.

19. The device of claim 16, wherein the lighting elements comprise light emitting diodes.

20. A vehicle accessory control interface, comprising:
a circuit board substrate;
a plurality of electronic components supported on the substrate, the plurality of electronic components including:
a plurality of lighting elements configured to provide light to a component situated in a vicinity of the circuit board substrate;
a plurality of drivers associated with the lighting elements for providing power to the lighting elements, respectively;
a controller that provides a power signal to each of the drivers, the controller being programmed to provide power to each driver to achieve a desired lighting characteristic of an associated one of the lighting elements;
a plurality of switches located on the circuit board substrate;
a single pad area made of circuit board conductor on the circuit board substrate in a location for each of the plurality of switches; and
wherein the plurality of drivers are arranged in a matrix comprising a plurality of rows; each row has at least one associated drive resistor electrically coupled in series with the row such that power supplied to the row flows through the drive resistor; and the controller is programmed to control a power signal to a selected driver based at least in part on a value of the drive resistor of the row in which the selected driver is situated; and
wherein the controller indicates at least one of an occupant position detection and an occupant presence detection using a conductor disposed within a vehicle seat with an electrical signal applied to the conductor to act as a carrier signal that is detected by a signal present at the pad area located on first circuit board substrate that is located behind the interface during one of proximity to and surface contact with the interface to determine which occupant is manipulating the interface.

* * * * *